United States Patent [19]
Horiuchi et al.

[11] Patent Number: 5,943,212
[45] Date of Patent: Aug. 24, 1999

[54] CERAMIC CIRCUIT BOARD AND SEMICONDUCTOR DEVICE USING SAME

[75] Inventors: Michio Horiuchi; Shigetsugu Muramatsu; Ryuichi Matsuki, all of Nagano, Japan

[73] Assignee: Shinko Electric Industries Co., Ltd., Nagano, Japan

[21] Appl. No.: 08/841,707

[22] Filed: Apr. 30, 1997

[30] Foreign Application Priority Data

May 1, 1996 [JP] Japan .................................. 8-110841

[51] Int. Cl.[6] ...................................................... H05H 7/20
[52] U.S. Cl. ........................ 361/704; 174/252; 174/261; 361/779; 361/719; 361/720; 428/901
[58] Field of Search ........................... 174/252, 255–256, 174/261–262, 723; 361/704, 707, 719–721, 760, 762, 777, 779, 791, 792, 793; 428/901

[56] References Cited

FOREIGN PATENT DOCUMENTS

5047842  2/1993  Japan ....................................... 361/720
6-350258  12/1994  Japan .

*Primary Examiner*—Gregory Thompson
*Attorney, Agent, or Firm*—Pennie & Edmonds LLP

[57] ABSTRACT

Thermal stress caused by a difference in the coefficient of thermal expansion between the mounting substrate and the ceramic substrate acts little on the junction portions of the external connection terminals when a semiconductor device is mounted avoiding such problems that the junction portions are broken or peeled off the mounting substrate. An insulating buffer layer 40 is adhered onto the mounting surface of ceramic substrate 32 having required wiring patterns 34 onto where the external connection terminals 12 will be connected, the insulating buffer layer 40 having a Young's modulus smaller than that of a ceramic material of the ceramic substrate 32 and having electrically insulating property, terminal pads 14 are provided on the outer surface of the insulating buffer layer 40, and the terminal pads 14 and the wiring patterns 34 are electrically connected together through buffer conducting portions 42 provided penetrating through the insulating buffer layer 40 and having a Young's modulus nearly equal to that of the insulating buffer layer 40.

11 Claims, 7 Drawing Sheets

(PRIOR ART)

Fig.13(b)

(EMBODIMENT)

CERAMIC CIRCUIT BOARD AND SEMICONDUCTOR DEVICE USING SAME

BACKGROUND OF THE INVENTION

1. Field of the Invention

The present invention relates to a ceramic circuit substrate and a semiconductor device using the same. More specifically, this invention relates to a ceramic circuit substrate having a feature in the constitution of junction portions of the external connection terminals and a semiconductor device using such a substrate.

2. Description of the Related Art

Semiconductor devices of the surface mounting type such as BGA (ball grid array)-type semiconductor devices have a problem in that, when the semiconductor devices are mounted, the external connection terminals are broken due to the thermal stress caused by a difference in the coefficient of thermal expansion between the mounting substrate and the semiconductor package. When a semiconductor device using a ceramic circuit substrate as a main body is mounted on a resin substrate such as printed substrate, in particular, the thermal stress due to a difference in the coefficient of thermal expansion becomes a problem since the coefficient of thermal expansion of the ceramic is from about 4 to $7 \times 10^{-6}/°$ C. whereas the thermal expansion of the resin substrate is about $15 \times 10^{-6}/°$ C.

In practice, when an alumina ceramic package having a coefficient of thermal expansion of about $7 \times 10^{-6}/°$ C. is mounted on a resin substrate such as of BT (bismaleimide triazine) resin, a package size of 25 mm square is a limit that can be mounted from the standpoint of reliability of the external connection terminals against the thermal stress. When a semiconductor device using a ceramic substrate as a main body is mounted on a resin substrate, as described above, limitation is imposed on the size of the package. Accordingly, a limitation is imposed on the number of the external connection terminals.

SUMMARY OF THE INVENTION

An object of the present invention is to provide a ceramic circuit substrate which enables the external connection terminals to be reliably connected by reducing the thermal stress acting on the junction portions of the external connection terminals when a semiconductor device is mounted and preventing the junction portions of the external connection terminals from being broken or peeled off, as well as to provide a semiconductor device using the same ceramic circuit substrate.

The above-mentioned object is accomplished by the present invention which is constituted as described below.

That is, a feature resides in that an insulating buffer layer is adhered onto the mounting surface of a ceramic substrate having required wiring patterns onto where the external connection terminals will be connected, said insulating buffer layer having a Young's modulus smaller than that of a ceramic material of said ceramic substrate and having electrically insulating property, terminal pads are provided on the outer surface of said insulating buffer layer, and said terminal pads and said wiring patterns are electrically connected together through buffer conducting portions provided penetrating through said insulating buffer layer and having a Young's modulus smaller than that of said ceramic material.

Another feature resides in that the insulating buffer layer and the buffer conducting layers have nearly the same Young's modulus.

A further feature resides in that the external connection terminals are joined to the terminal pads.

A still further feature resides in that the buffer conducting portions and the wiring patterns are electrically connected together through connection wirings provided on a boundary surface between the ceramic substrate and the insulating buffer layer.

A yet further feature resides in that the insulating buffer layer is composed of an organic resin such as an epoxy, a bismaleimide triazine, a polyimide, a polyphenylene ether, a cyanate or the like.

A still further feature resides in that the insulating buffer layer contains at least one kind of oxides such as alumina, silica, mullite, nitrides such as aluminum nitride, or glasses in the form of a powder or a fiber.

A further feature resides in that the buffer conducting portions are formed of an electrically conducting paste containing at least one kind of metal powder such as of copper, silver, gold, aluminum or nickel.

Another feature resides in that the electrically conducting paste contains an organic resin material used for the insulating buffer layer.

A further feature resides in that the outer surfaces of the insulating buffer layer are covered with a solder resist except said terminal pads.

A further feature resides in that the semiconductor device comprises a semiconductor element mounted on the ceramic circuit substrate, and the semiconductor element is electrically connected to the wiring pattern.

Another feature resides in that a cavity is formed in the ceramic substrate to hold the semiconductor element.

A still further feature resides in that a through hole is formed in the ceramic substrate to hold the semiconductor element, a heat-radiating plate is joined to the surface of the ceramic substrate of the side opposite to the surface on where the insulating buffer layer is provided, and the semiconductor element is supported by the heat-radiating plate.

DESCRIPTION OF THE PREFERRED EMBODIMENTS

Before explaining the preferred embodiments of this invention, a conventional method and the problems thereof will be described below.

Figure 11:
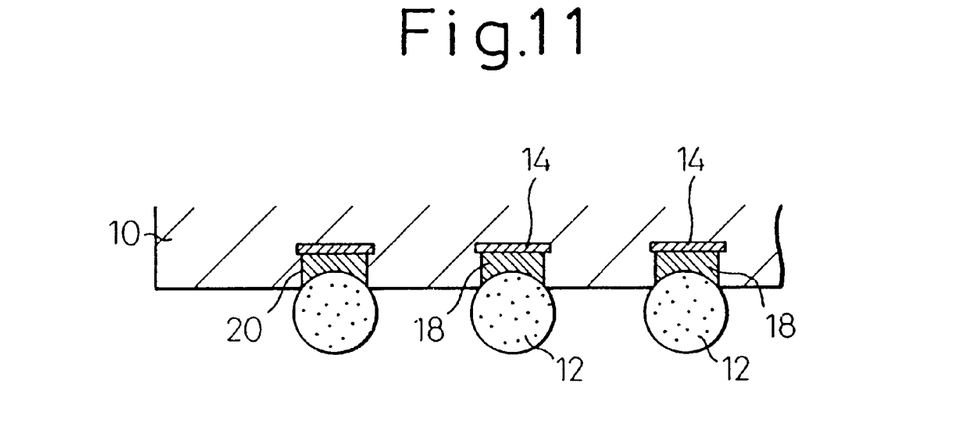
FIG. 11 is a sectional view illustrating a conventional constitution of junction portions of a semiconductor device.

A conventional method of solving a problem that arises when a semiconductor device using a ceramic circuit substrate is mounted, is shown in FIG. 11, according to which recessed portions 20 are formed in the mounting surface of a ceramic circuit substrate 10 to be in match with the terminal pads 14, and the recessed portions 20 are filled with a solder to form solder junction portions 18 to which the external connection terminals 12 will be joined. FIG. 11 illustrates a state where solder balls are joined as external connection terminals 12 through the solder junction portions 18.

Figure 12:
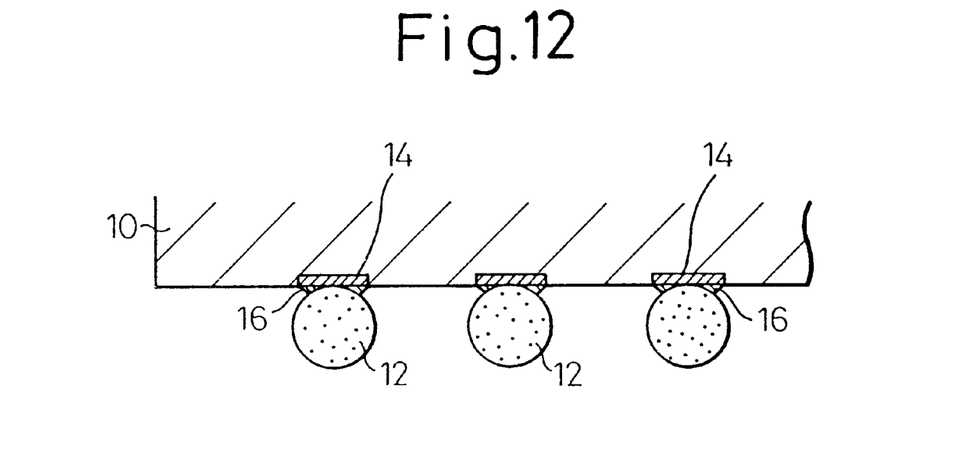
FIG. 12 is a sectional view illustrating a conventional constitution of junction portions of a semiconductor device.

FIG. 12 illustrates a conventional method of mounting a semiconductor device, wherein solder balls are joined and mounted, by using a low-melting solder 16, onto terminal pads 14 formed on the mounting surface of the ceramic circuit substrate 10. In the semiconductor device having the solder junction portions 18, the junction portions which are weak against distortion are held in the recessed portions formed in the ceramic circuit substrate 10, the point of concentration of stress is moved to portions other than the junction portions, so that the junction portions of the external connection terminals will not be broken when the ceramic circuit substrate is mounted.

According to the above-mentioned conventional methods in which the holder junction portions 18 are provided so that the external connection terminals 12 exhibit enhanced durability against the thermal stress when the ceramic circuit substrate is mounted, however, a considerable degree of thermal stress still acts on the junction portions accompanying an increase in the size of the semiconductor package or an increase in the number the external connection terminals.

When the junction portions are formed by forming recessed portions in the mounting surface of the semiconductor device, furthermore, there arises a problem in that it is not allowed to employ an ordinary method of joining the external connection terminals 12 to the terminal pads 14 formed on the mounting surface.

Preferred embodiments of the present invention for solving the above-mentioned problems will now be described with reference to the accompanying drawings.

Figure 1:
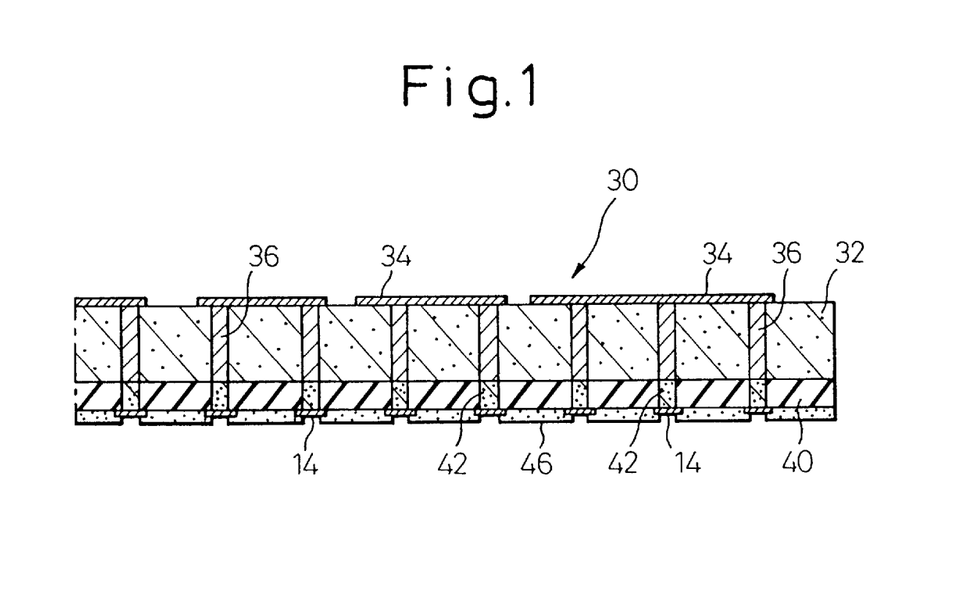
FIG. 1 is a sectional view illustrating a ceramic circuit substrate according to a first embodiment of the present invention.

FIG. 1 is a sectional view of a ceramic circuit substrate 30 according to a first embodiment of the present invention. In the ceramic circuit substrate 30 according to this embodiment, an insulating buffer layer 40 having electrically insulating property is mounted on the mounting surface of a ceramic substrate 32 which is a main body of the ceramic circuit substrate 30 and onto where the external terminals will be connected, and terminal pads 14 to which the external connection terminals 12 (FIGS. 4 to 7) will be joined are provided on the outer surface of the insulating buffer layer 40.

The ceramic substrate 32 is provided with wiring patterns 34 electrically connected to semiconductor elements mounted on the ceramic circuit substrate 30, and with internal wiring patterns for electrically connecting the external connection terminals and the wiring patterns 34 together. Reference numeral 36 denotes vias which are internal wiring patterns.

The ceramic material used for the ceramic substrate 32 will be the one used for the conventional ceramic packages, such as alumina ceramic, aluminum nitride ceramic, mullite ceramic, or glass ceramic. The wiring patterns 34, internal wiring patterns and vias 36 are formed in the same manner as the conventional method of producing ceramic circuit substrates. That is, a ceramic green sheet is coated with a metallizing paste by a screen-printing method, or the vias are filled with a metallizing paste followed by firing at a predetermined temperature to obtain a sintered ceramic substrate 32 having wiring patterns 34 and vias 36.

The ceramic substrate 32 can be formed as a single-layer substrate by using a single layer of ceramic green sheet, or can be formed as a multi-layer substrate by laminating the ceramic green sheets in may layers. The ceramic substrate 32 may have a cavity formed at a portion where the semiconductor element will be mounted, or may not have a cavity.

The insulating buffer layer 40 is formed being mounted on the mounting surface of the ceramic substrate 32 integrally therewith. The insulating buffer layer 40 is adhered onto the outer mounting surface of the ceramic substrate 32 and works to decrease the thermal stress that acts on the external connection terminals 12 joined to the terminal pads 14 when the ceramic circuit board 30 is mounted. Therefore, the insulating buffer layer 40 must be composed of a material having a Young's modulus smaller than that of a ceramic material constituting the ceramic substrate 32, and should desirably have a Young's modulus of not larger than about $1.0 \times 10^4$ kgf/mm$^2$. The insulating buffer layer 40 should have a thickness of not smaller than about 50 $\mu$m so as to produce buffer action.

Preferred examples of the material constituting the insulating buffer layer 40 will be organic resins such as an epoxy, a bismaleimide triazine, a polyimide, a polyphenylene ether and a cyanate. In order that the insulating buffer layer 40 exhibits a predetermined strength, the organic resin material may be blended with at least one kind of oxides such as alumina, silica, mullite, nitrides such as aluminum nitride or glasses. The oxides, nitrides or glasses are used in the form of a powder or a fiber.

The insulating buffer layer 40 can be adhered onto the ceramic substrate 32 by a method in which a sheet-like material of the organic resin material is adhered using an adhesive, a method in which a sheet-like material is used in a B-stage (semi-solid state of a thermosetting resin) or in a C-stage (soft state of a thermoplastic resin) so as to be adhered onto the ceramic substrate 32 as a unitary structure upon the application of heat and pressure by utilizing the adhesiveness of the sheet-like material itself, or a method of coating a paste or a liquid.

Terminal pads 14 for connection to the external connection terminals 12 are provided on the outer surface of the insulating buffer layer 40. Buffer conducting portions 42 are provided in the insulating buffer layer 40 to electrically connect the terminal pads 14 to the vias 36 in the ceramic substrate 32. The buffer conducting portions 42 work to electrically connect the terminal pads 14 to the vias 36, and further work to decrease the thermal stress acting on the external connection terminals 12 joined to the terminal pads 14.

As shown in FIG. 1, the buffer conducting portions 42 according to this embodiment are arranged in flush with the end surfaces of the vias 36 formed in the ceramic substrate 32, and are directly connected to the end surfaces of the vias 36.

Figure 2:
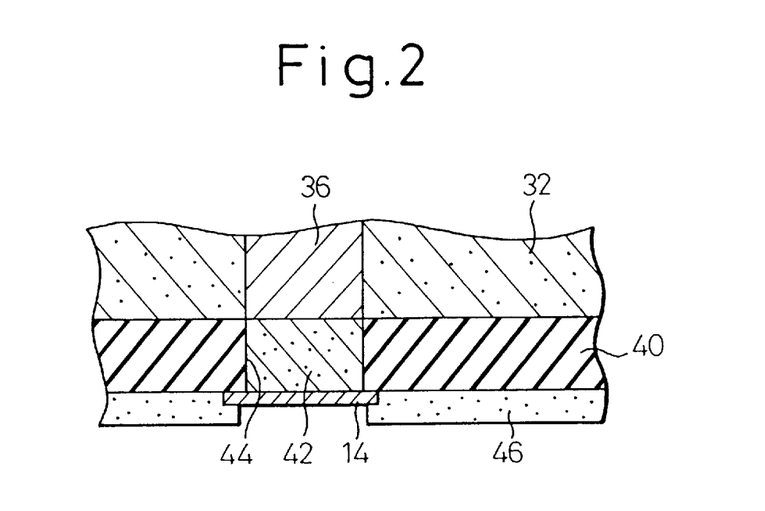
FIG. 2 is a sectional view illustrating, on an enlarged scale, the neighborhood of a junction portion between a buffer conducting portion and a via in the ceramic circuit substrate according to the first embodiment.

FIG. 2 illustrates a connection portion between the buffer conducting portion 42 and the via 36 on an enlarged scale. The buffer conducting portion 42 is disposed being sandwiched between the terminal pad 14 and the end surface of the via 36 formed in the ceramic substrate 32, and is adhered at its both end surfaces to the terminal pad 14 and to the via 36.

In order to obtain buffer action according to this embodiment, the buffer conductor portion 42 is formed by using an electrically conducting paste comprising one or more kinds of metal powders such as of copper, silver, gold, aluminum and nickel and, preferably, a silver powder or a copper powder, and an organic binder of an organic resin such as an epoxy, a bismaleimide triazine, a polyimide, a polyphenylene ether or a cyanate.

The buffer conducting portion 42 is formed by a method in which a conducting hole 44 is formed in a sheet-like material formed by using an organic resin such as an epoxy, a bismaleimide triazine, a polyimide, a polyphenylene ether or a cyanate at a position where the buffer conducting portion 42 will be formed relying upon drilling, irradiation with a laser beam, patching or etching, and the conducting hole 44 is filled with the electrically conducting paste, a method in which a pole is formed by using the electrically conducting paste on the ceramic substrate 32, and a liquid of the organic resin is applied to the surface of the ceramic substrate 32 followed by polishing, or a method in which a sheet-like material of a B-stage (semi-solid state of a thermosetting resin) is adhered in place of applying a liquid and, at the same time, the sheet-like material is penetrated with a pole to form the buffer conducting portion 42.

When an organic binder of the same kind as the organic resin forming the insulating buffer layer 40 is used as an electrically conducting paste for forming the buffer conducting portion 42, flexibility comparable to that of the material of the insulating buffer layer 40 is exhibited even by the buffer conducting portion 42, and a suitable buffer action is offered to the external connection terminal 12 joined to the terminal pad 14. By using the organic binder having nearly the same Young's modulus as that of the insulating buffer layer 40, furthermore, the buffer conducting portion 42 exhibits affinity to the material of the insulating buffer layer 40 enabling the insulating buffer layer 40 as a whole to exhibit a favorable buffer action. Even when the buffer conducting portion 42 has a Young's modulus which is slightly different from that of the insulating buffer layer 40, the buffer effect is exhibited to a sufficient degree provided the Young's modulus is smaller than the Young's modulus of the ceramic material constituting the ceramic substrate 32.

The electrically conducting paste contains an organic binder that forms the insulating buffer layer 40, in order that the buffer conducting portion 42 is joined to the via 36 to obtain electric conduction at the time when the insulating buffer layer 40 is adhered onto the ceramic substrate 32 as a unitary structure.

Referring to FIG. 2, the outer surface of the insulating buffer layer 40 is coated with a protection film of solder resist 46 except the portions where the terminal pads 14 are formed. The ceramic circuit substrate 30 shown in FIG. 1 has mounting surfaces on where the terminal pads 14 are exposed maintaining a predetermined pattern, and the surfaces other than the terminal pads 14 are covered with the solder resist 46, presenting the appearance which is the same as that of the conventional ceramic circuit substrate having terminal pads 14 formed on the outer surface of the ceramic substrate, and, hence, the external connection terminals 12 can be joined quite in the same manner as that of the prior art.

Figure 3:
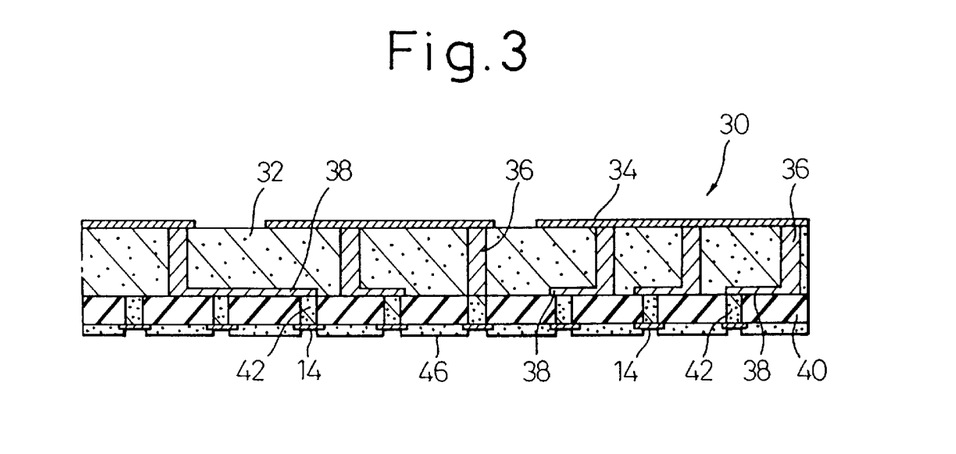
FIG. 3 is a sectional view of the ceramic circuit substrate according to a second embodiment of the present invention.

FIG. 3 illustrates the ceramic circuit substrate 30 according to another embodiment of the present invention. The ceramic circuit substrate 30 according to this embodiment has a feature in that the terminal pad 14 formed on the outer surface of the insulating buffer layer 40 is electrically connected to the via 36 through a connection wiring 38 that is interposed between the via 36 and the buffer conducting portion 42 on a boundary surface between the ceramic substrate 32 and the insulating buffer layer 40, instead of directly connecting the buffer conducting portion 42 to the end surface of the via 36.

The connection wiring 38 is formed as a wiring pattern that electrically connects to the via 36 on the surface of the ceramic substrate 32 on where the insulating buffer layer 40 will be formed, and is connected to the buffer conducting portion 42 by adhering the insulating buffer layer 40 in match therewith. As a sheet-like material that serves as the insulating buffer layer 40, furthermore, the connection wiring 38 that electrically connects to the buffer conducting portion 42 is formed on the surface that joins to the ceramic substrate 32, and the sheet-like material is joined to the ceramic substrate 32 in match therewith, so that the via 36 and the buffer conducting portion 42 are electrically connected together through the connection wiring 38.

With the via 36 and the buffer conducting portion 42 being connected together through the connection wiring 38 as in this embodiment, there is obtained an advantage in that the buffer conducting portions 42 can be arranged irrespective of the layout of internal wiring patterns such as vias 36 in the ceramic substrate 32. In the embodiment shown in FIG. 3, the vias 36 are not arranged maintaining an equal distance, but the buffer conducting portions 42 are regularly arranged by utilizing the connection wirings 38. By regularly arranging the external connection terminals 12, as described above, margin is imparted to installation space.

Figure 4:
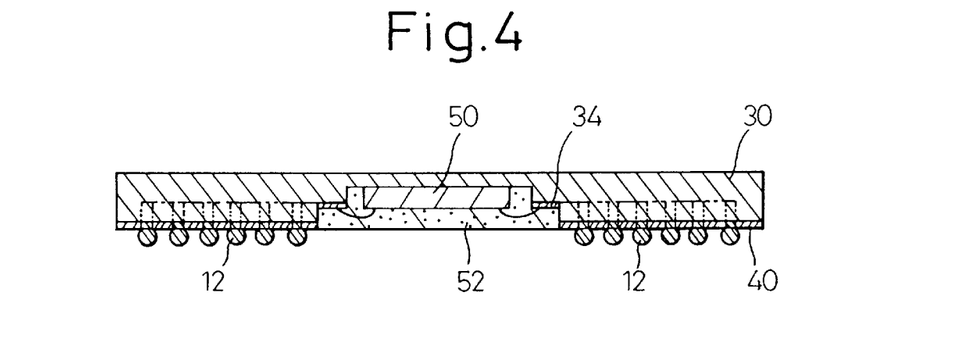
FIG. 4 is a sectional view of a semiconductor device using the ceramic circuit substrate.

FIGS. 4 to 7 illustrate semiconductor devices mounting a semiconductor element 50 as examples of applying the above-mentioned ceramic circuit substrate 30. FIG. 4 illustrates a semiconductor device of down-cavity type in which the semiconductor element 50 is attached by dieing to the ceramic circuit substrate 30, the wiring pattern 34 and the semiconductor element 50 are connected together through wire bonding, solder balls are joined to the terminal pads 14 as external connection terminals 12, and the semiconductor element 50 is sealed by potting. Reference numeral 52 denotes a potting resin.

Figure 5:
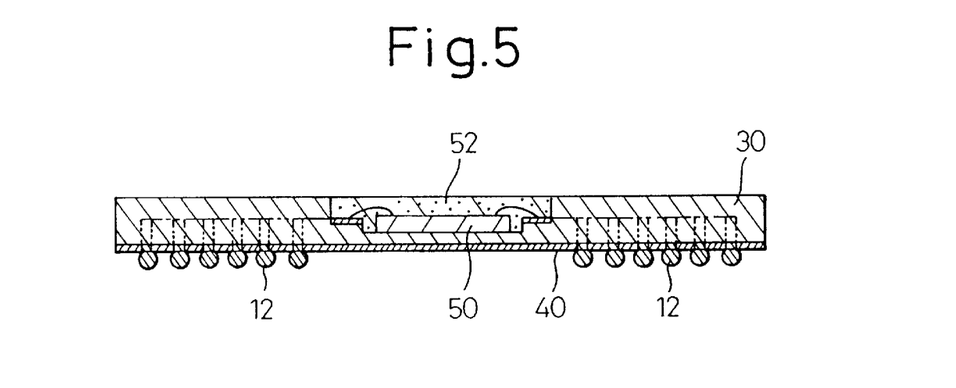
FIG. 5 is a sectional view of a semiconductor device using the ceramic circuit substrate.

FIG. 5 illustrates a semiconductor device of the up-cavity type wherein the constitution in which the external connection terminals 12 are connected through the insulating buffer layer 40 and the buffer conducting portions 42, is the same as that of the down-cavity type semiconductor device.

Figure 6:
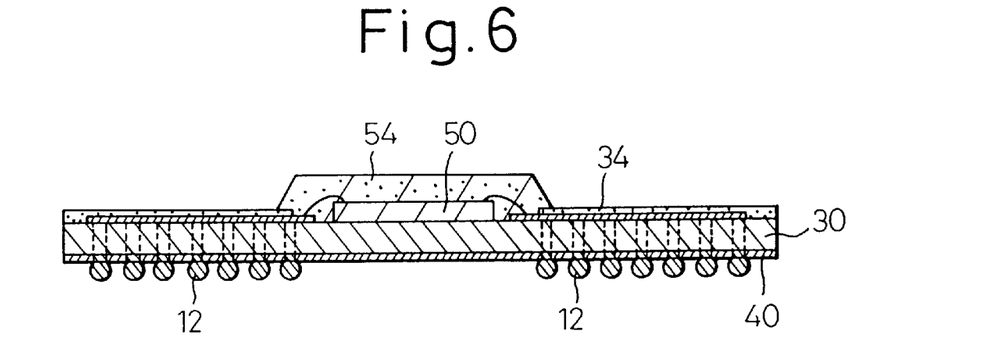
FIG. 6 is a sectional view of a semiconductor device using the ceramic circuit substrate.

FIG. 6 illustrates a semiconductor device in which the semiconductor element 50 is attached by dieing to the upper surface of the ceramic circuit board 30 without any cavities, the wiring pattern 34 and the semiconductor element 50 are connected together by wire bonding, the semiconductor element 50 is sealed with a resin, and solder balls are joined to the terminal pads of the ceramic circuit substrate 30. Reference numeral 54 denotes a sealing resin.

Figure 7:
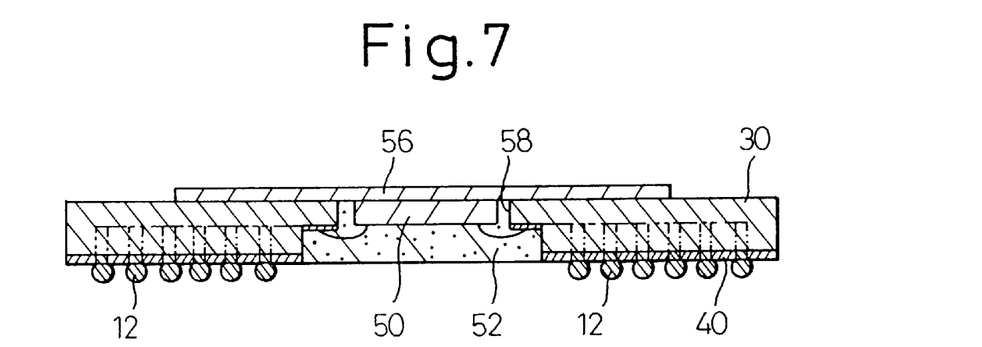
FIG. 7 is a sectional view of a semiconductor device using the ceramic circuit substrate.

FIG. 7 illustrates a semiconductor device with a heat-radiating plate, wherein the ceramic substrate is provided with a through hole 58 for containing a semiconductor element, and the heat-radiating plate 56 is attached by brazing to the surface of the side opposite to the surface on where the insulating buffer layer 40 is provided.

Figure 8:
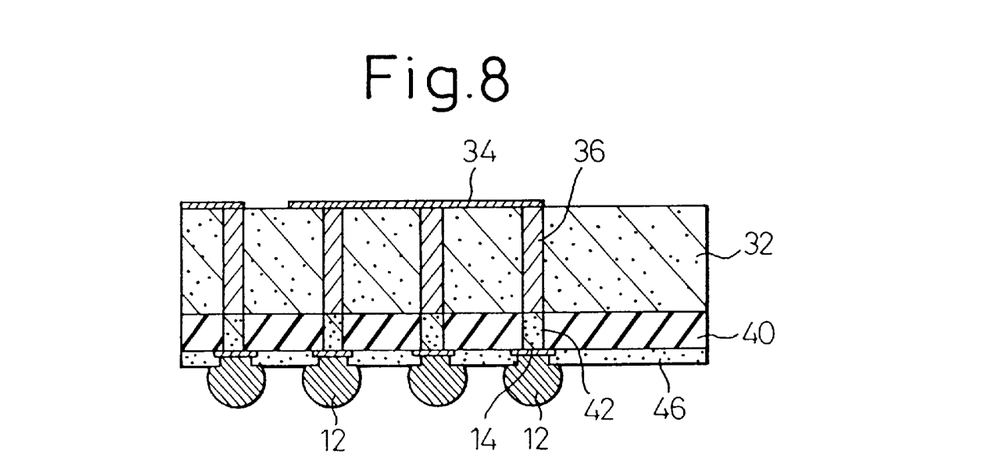
FIG. 8 is a sectional view illustrating, on an enlarged scale, the neighborhood of the junction portions of external connection terminals.

FIG. 8 illustrates, on an enlarged scale, junction portions of the external connection terminals 12 of the above-mentioned semiconductor device. The external connection terminals 12 are joined to the terminal pads 14 formed on the outer surface of the insulating buffer layer 40 via a low-melting metal such as solder or the like.

In the semiconductor device of the embodiment as shown in FIG. 8, the external connection terminals 12 are not directly connected to the ceramic substrate 32 which constitutes the main body of the semiconductor device, but are connected with the insulating buffer layer 40 interposed therebetween and, besides, the terminal pads 14 joined to the external connection terminals are connected to the vias 36 through the buffer conducting portions 42. Therefore, even the terminal pads 14 produce buffer action.

Thus, even when the thermal stress is exerted on the external connection terminals 12 due to a difference in the coefficient of thermal expansion between the ceramic substrate and the resin substrate as a result of mounting the semiconductor device on the resin substrate, the thermal stress is effectively absorbed by the insulating buffer layer 40 and the buffer conducting portions 42, making it possible to effectively prevent the external connection terminals 12 from being broken or peeled off. This makes it possible to mount a semiconductor device which uses a large ceramic circuit substrate which, so far, could not be mounted on the resin substrate, and to easily increase the number of the external connection terminals.

The above-mentioned embodiments have dealt with the semiconductor devices in which the solder balls were joined to the terminal pads 14 as external connection terminals 12. It is, however, allowable to use copper balls plated with solder as external connection terminals 12 for surface mounting. It is further possible to mount the semiconductor element directly on the mounting substrate at the terminal pads 14 using a low-melting metal such as solder without using external connection terminals 12 such as solder balls. The ceramic circuit substrate of this embodiment is provided with the insulating buffer layer 40 and with buffer conducting portions 42, and can, hence, be favorably used even when the semiconductor element is directly mounted on the mounting substrate.

Practical examples for producing the ceramic circuit substrate 30 according to the present invention will now be described.

(EXAMPLE 1)

Figure 9A:
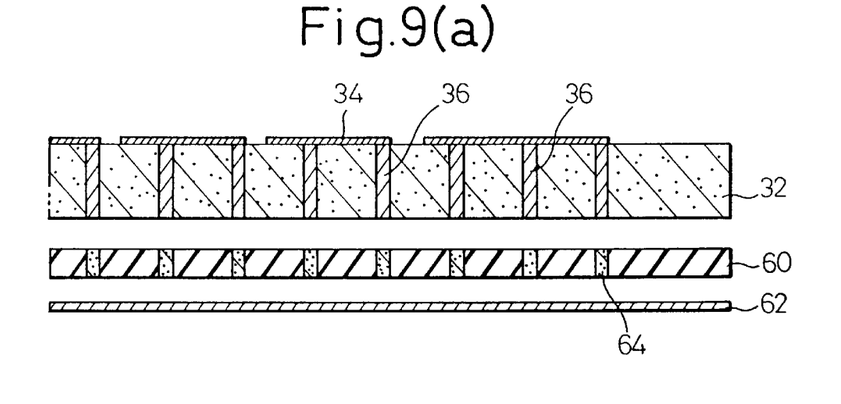
FIG. 9 is a diagram illustrating a process for producing the ceramic circuit substrate.
Figure 9B:
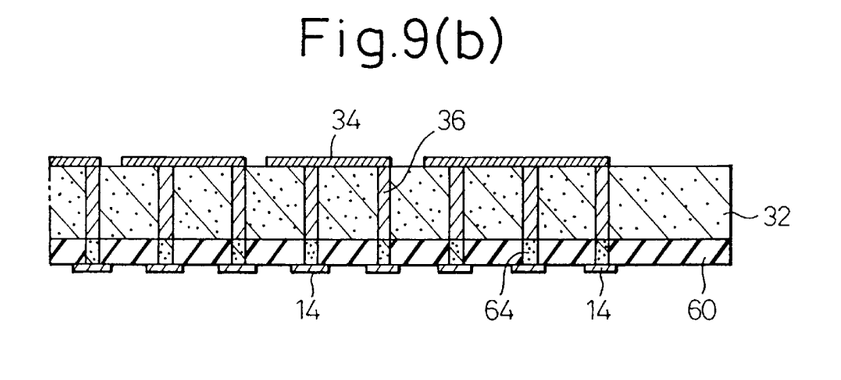
Figure 9C:
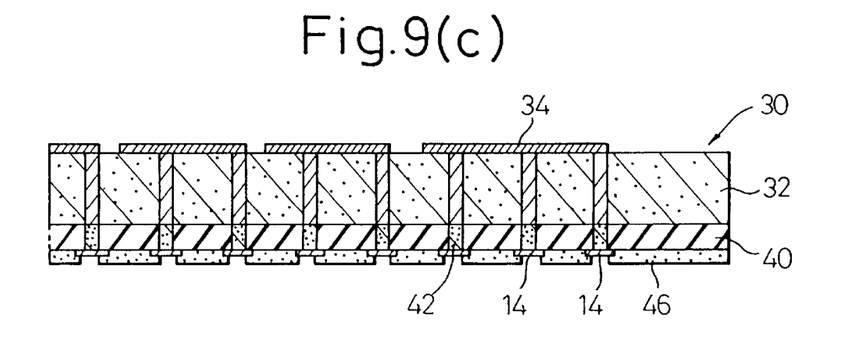

FIGS. 9(a) to 9(c) illustrate respective steps of a process for producing the ceramic circuit substrate 30 according to the embodiment.

FIG. 9(a) illustrates a state where a prepreg 60 and a copper foil 62 are to be joined as a unitary structure to a ceramic substrate 32 which constitutes the main body of the ceramic circuit substrate 30. The prepreg 60 serves as the insulating buffer layer 40, and the copper foil 62 forms terminal pads 14 on the outer surface of the insulating buffer layer 40. The copper foil 62 used here has a thickness of about 18 μm.

The ceramic substrate 32 of the embodiment is a 98% alumina ceramic substrate having a thickness of about 0.64 mm. On the ceramic circuit substrate 32 are formed in advance wiring patterns 34 and vias 36 according to a customary method.

The prepreg 60 is of the epoxy type containing aramid fibers and having a thickness of about 100 μm. In the prepreg 60 are formed conducting holes of a diameter of about 300 μm by using a $CO_2$ laser maintaining a pitch of 1.27 mm, and the conducting holes are filled with a silver paste 64. The prepreg 60 shown in FIG. 9(a) has been filled with the silver paste 64.

The ceramic substrate 32 and the prepreg 60 are brought into match with each other, the copper foil 62 is placed on the prepreg 60 and is pressed with a force of about 30 kg/cm$^2$ for about two hours while being heated at about 200° C., so that the ceramic substrate 32, prepreg 60 and copper foil 62 are adhered together.

Thus, the prepreg 60 and the ceramic substrate 32 are joined together, and the silver paste 64 and the vias 36 are joined together.

Then, the surface of the copper foil 62 is coated with a resist, exposed to light, and is developed, so that the etching resist layer is left in the shape of terminal pads 14, and the terminal pads 14 are formed by etching the copper foil 62 with the etching resist layer as a mask. FIG. 9(b) shows a state where the etching resist layer is removed to form the terminal pads 14 on the surface of the prepreg 60.

Next, the surface of the prepreg 60 is coated with a photosensitive solder resist 46 to cover the terminal pads 14, and is exposed to light and is developed to form openings of a diameter of 0.7 mm on the terminal pads 14. Then, the surfaces of the terminal pads 14 and the surfaces of the wiring patterns 34 are plated with nickel and gold for protection to obtain a ceramic circuit substrate 30 (FIG. 9(c)). The prepreg 60 corresponds to the insulating buffer layer 40 and the silver paste 64 corresponds to the buffer conducting portion 42.

(EXAMPLE 2)

In the above-mentioned process for production, conducting holes 44 are formed in the prepreg 60 to provide an insulating buffer layer 40 and are filled with the silver paste. It is, however, also possible to form the insulating buffer layer 40 by a process for production shown in FIGS. 10(a) to 10(d) by adapting a process for producing a printed substrate disclosed in Japanese Unexamined Patent Publication (Kokai) No. 6-350258.

Figure 10A:
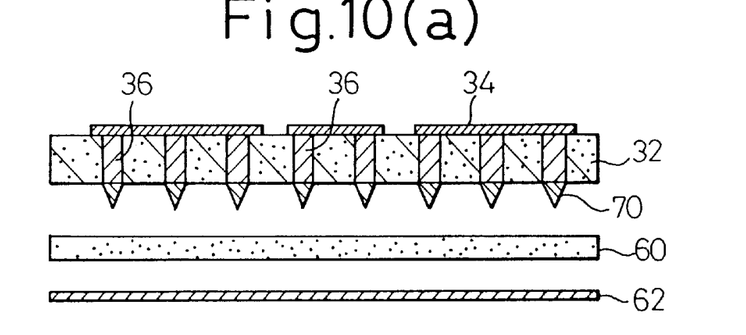
FIG. 10 is a diagram illustrating another process for producing the ceramic circuit substrate.

That is, electrically conducting bumps 70 are formed at one time by a bump-printing method on the end surfaces of the vias 36 of the ceramic substrate 32 in match with the vias 36 (FIG. 10(a)). The bump-printing method has a feature in that the ends are formed in a sharp conical shape as shown.

Figure 10B:
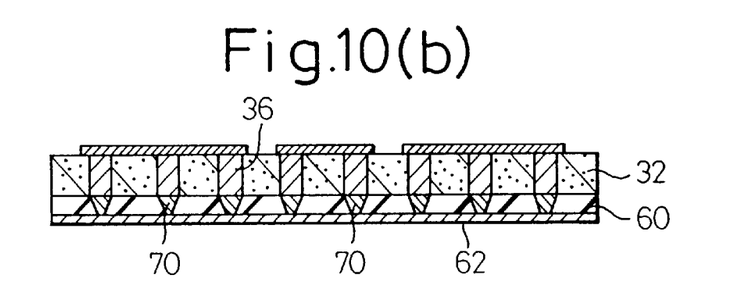

Next, the prepreg 60 is placed on the electrically conducting bumps 70, the copper foil 62 is placed thereon, the electrically conducting bumps 70 are caused to penetrate through the prepreg 60 by the application of heat and pressure, and the copper foil 62 and the prepreg 60 are adhered onto the ceramic substrate 32 (FIG. 10(b)). The electrically conducting bumps 70 are forced to penetrate through the prepreg 60 in a state where the prepreg 60 is softened. The ends of the electrically conducting bumps 70 that have penetrated through the prepreg 60 bite into the copper foil 62 to accomplish good electric conduction.

Figure 10C:
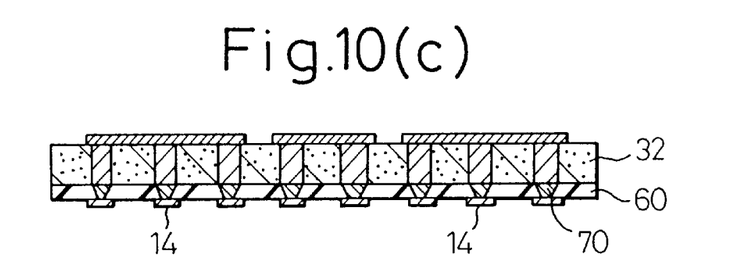
Figure 10D:
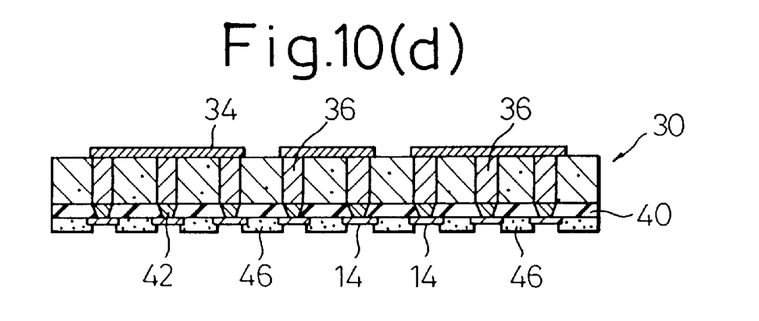

Then, the terminal pads 14 are formed by etching the copper foil 62 (FIG. 10(c)). The terminal pads 14 are formed being connected to the electrically conducting bumps 70, i.e., being connected to the buffer conducting portions 42, and are electrically connected to the vias 36 through the buffer conducting portions 42.

Next, the surface of the prepreg 60 or insulating buffer layer 40 is coated with the photosensitive solder resist 46, exposed to light and is developed, so that the surfaces of the insulating buffer layer 40 are covered with the solder resist 46 except the terminal pads 14. There is thus obtained a ceramic circuit substrate 30 having the insulating buffer layer 40, buffer conducting portions 42 and terminal pads 14 (FIG. 10(d)).

According to the method of producing the ceramic circuit substrate 30 of this embodiment, the electrically conducting bumps 70 are formed at one time by the bump-printing method to thereby form the buffer conducting portions 42. Therefore, the ceramic circuit board 30 is produced easily and at a decreased cost compared with that of the above-mentioned embodiment. Moreover, the bump-printing method makes it possible to highly densely form the buffer conducting portions 42 and to arbitrarily set the patterns for forming the buffer conducting portions 42, offering advantage for the production of ceramic circuit substrate 30.

The results of a simulation test regarding an application from an analysis of the ceramic circuit substrate, will now be described.

In a ceramic BGA (Ball Grid Array) package, due to the difference in the coefficient of thermal expansion between the substrate and the ceramic package, the solder connecting portions, i.e., bumps, are subjected to a large stress when the package is mounted on the substrate. To avoid this, a package having a compliant structure as mentioned above has been proposed in accordance with the present invention. It has been confirmed that the strain exerted on the bumps becomes smaller as compared with the conventional ceramic package. Here, assuming that a strain generated in a conventional type 25 mm square ceramic BGA package as a sample is a limited value, a possible package size of the compliant structure type ceramic BGA package will be estimated.

The material used in the simulation test and Young's module, Poisson's ratio and TCB (ppm/° C.) of the material are shown on the following table.

| | Material Properties | | |
|---|---|---|---|
| Material | Young's Modules [GPa] | Poisson's Ratio | TCE [ppm/deg ° C.] |
| Pc-Board (FR-4) | 18.6 | 0.19 | 15 |
| Solder | 4.9 | 0.36 | 29 |
| Alumina | 307.9 | 0.23 | 7 |
| Epoxy (Resin) | 19.6 | 0.2 | 7 |
| Ag Paste | 5.6 | 0.4 | 50 |

Figure 13A:
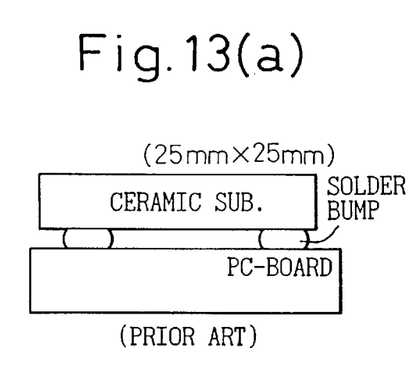
FIGS. 13(a) and 13(b) are schematic cross-sectional views of a model for simulation analysis test, with FIG. 13(a) illustrating a prior art device and FIG. 13 (b) illustrating an embodiment of the invention.
Figure 13B:
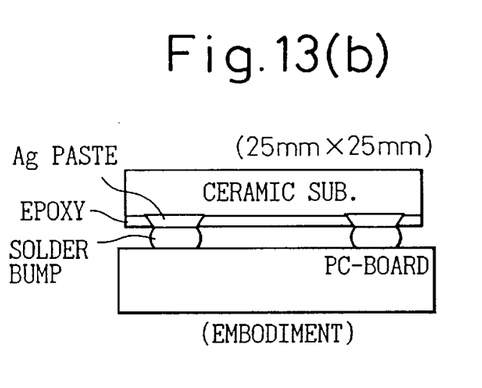
Figure 14:
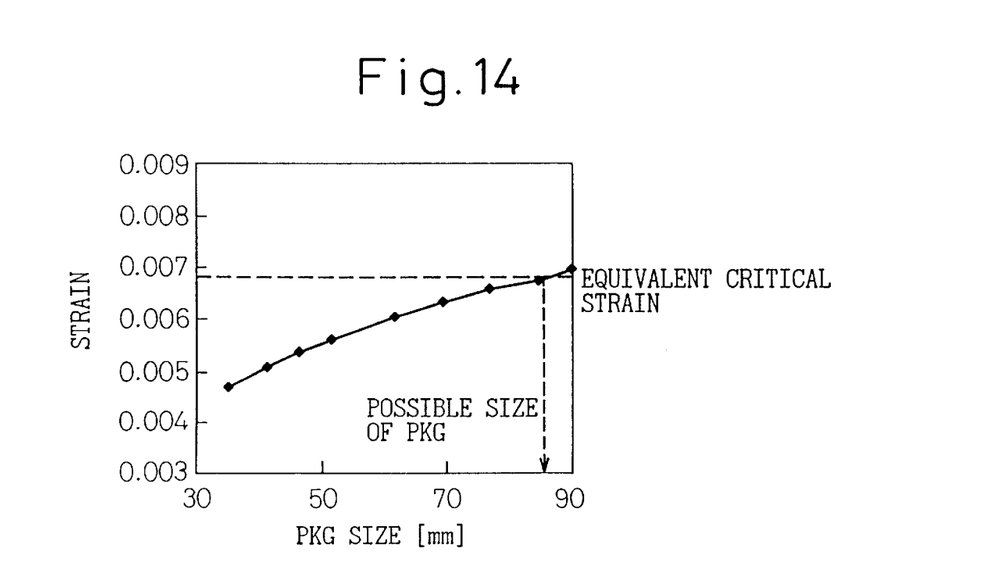
FIG. 14 is a graph showing the relationship between the package size and the strain exerted on the solder bump.

The results of the analysis test are shown in FIGS. 13(a), 13(b) and 14. FIG. 13(a) shows a cross-sectional structure of an analysis model on the basis of prior art; FIG. 13(b) shows a cross-sectional structure of an analysis model according to the embodiment of this invention; and FIG. 14 shows the relationship between the package size of the model shown in FIG. 13(b) and the strain exerted on the solder bumps. The broken line shows the maximum strain of the conventional type 25 mm square ceramic BGA (i.e. prior art) package. Assuming that a package size should be determined on the basis of the intersection between the above-mentioned broken line and a curve representing a strain-size of the compliant type ceramic BGA package (i.e. embodiment of this invention), the size would be 85 mm square.

As understood from the results shown in FIG. 14, according to the sample test of the embodiments of this invention, a stress reduction effect can be obtained remarkably as compared with the prior art samples.

However, it should be noted that the analysis was a linear stationary analysis and the solder was assumed to be an elastic member. Also, it should be noted that the evaluation of strain was only focussed on the solder bumps, but no consideration was given to the reliability of the other portions. Therefore, it is necessary to determine the particulars considering also such factors. It should be expected, however, that such a method is effective in a surface mounting package or a multi-pin package to maintain a mounting reliability, which has been one of the drawbacks of a conventional ceramic package.

In the ceramic circuit substrate and the semiconductor device using the ceramic circuit substrate of the present invention as described above, the external connection terminals are supported via the insulating buffer layer and the buffer conducting portions when the external connection terminals are joined to the terminal pads. This makes it possible to effectively decrease the thermal stress that acts on the junction portions of the external connection terminals being caused by a difference in the coefficient of thermal expansion between the mounting substrate and the ceramic substrate and, hence, to effectively avoid such problems in that the junction portions of the external connection terminals are broken or peeled off the mounting substrate. It is therefore made possible to mount a large semiconductor device using a ceramic substrate as a main body and to increase the number of external connection terminals.

We claim:

1. A ceramic circuit substrate board:
   a ceramic substrate having a predetermined wiring pattern and a mounting surface on which external connecting terminals are to be connected;
   an insulating buffer layer having a first surface adhered to said mounting surface of the ceramic substrate, said insulating buffer layer having electrically insulating property and a Young's modulus smaller than that of a ceramic material of said ceramic substrate, and said insulating buffer layer having a second, outer surface;
   terminal pads provided on said second, outer surface of the insulating buffer layer; and
   buffer electrical connecting portions, formed of electrically conducting paste containing metal powders in organic resin, provided to penetrate through said insulating buffer layer, said buffer electrical connecting portions having a Young's modulus smaller than that of a ceramic material of said ceramic substrate and electrically connecting said terminal pads directly, or by means of connecting vias of said ceramic substrate to said wiring pattern of the ceramic substrate.

2. A ceramic circuit substrate according to claim 1, wherein the insulating buffer layer and the buffer electrical connecting portions have nearly the same Young's modulus.

3. A ceramic circuit substrate according to claim 1, wherein the external connection terminals are joined to the terminal pads.

4. A ceramic circuit substrate according to claim 1, wherein the buffer connecting portions and the wiring pattern are electrically connected together by wiring.

5. A ceramic circuit substrate according to claim 1, wherein the insulating buffer layer is composed of an organic resin such as an epoxy, a bismaleimide triazine, a polyimide, a polyphenylene ether or a cyanate.

6. A ceramic circuit substrate according to claim 5, wherein the insulating buffer layer contains at least one kind of oxides such as alumina, silica, mullite, nitrides such as aluminum nitride, or glasses in the form of a powder or a fiber.

7. A ceramic circuit substrate according to claim 1, wherein said electrically conducting paste contains copper, silver, gold, aluminum or nickel.

8. A ceramic circuit substrate according to claim 1, wherein the outer surface of the insulating buffer layer is covered with a solder resist except said terminal pads.

9. A semiconductor device comprising:
   a ceramic circuit substrate board comprising:
      a ceramic substrate having a predetermined wiring pattern and a mounting surface on which external connecting terminals are to be formed:
      an insulating buffer layer having a first-surface adhered to said mounting surface of the ceramic substrate, said insulating buffer layer having electrically insulating property and a Young's modulus smaller than that of a ceramic material of said ceramic substrate, and said insulating buffer layer having a second, outer surface;
      terminal pads provided on said second, outer surface of the insulating buffer layer; and
      buffer electrical connecting portions, formed of electrically conducting paste containing metal powders in organic resin, provided to penetrate through said insulating buffer layer, said buffer electrical connecting portions having a Young's modulus smaller than that of a ceramic material of said ceramic substrate and electrically connecting said terminal pads directly, or by means of connecting vias of said ceramic substrate to said wring pattern formed on said wiring pattern of the ceramic substrate;
   a semiconductor element mounted on said ceramic circuit substrate; and means for electrically connecting said semiconductor element to said wiring patterns.

10. A semiconductor device according to claim 10, wherein a cavity is formed in the ceramic substrate to hold the semiconductor element.

11. A semiconductor device according to claim 10, wherein a through hole is formed in the ceramic substrate to mount the semiconductor element, a heat-radiating plate is joined to a surface of the ceramic substrate on a side opposite to the surface on which the insulating buffer layer is provided, and the semiconductor element is supported by said heat-radiating plate.

* * * * *

UNITED STATES PATENT AND TRADEMARK OFFICE
CERTIFICATE OF CORRECTION

PATENT NO. : 5,943,212

DATED : August 24, 1999

INVENTOR(S) : Michio Horiuchi et al.

It is certified that error appears in the above-identified patent and that said Letters Patent is hereby corrected as shown below:

On the title page at "[54] Title": change "BOARD" to --SUBSTRATE--.

Column 11, line 21 (claim 9, line 6): change "first-surface" to --first surface--.

Column 12, line 14: after "; and" start a new paragraph.

Column 12, line 17 (claim 10, line 1): change "10" to --9--.

Column 12, line 20 (claim 11, line 1): change "10" to --9--.

Signed and Sealed this

Twenty-third Day of May, 2000

Attest:

Q. TODD DICKINSON

*Attesting Officer*     *Director of Patents and Trademarks*